United States Patent
Glasser

(10) Patent No.: US 6,697,980 B1
(45) Date of Patent: Feb. 24, 2004

(54) DIE FAULT TESTING UTILIZING AN EXCLUSIVE-OR NETWORK OF GATES

(75) Inventor: Gabi Glasser, Talmon (IL)

(73) Assignee: Intel Corporation, Santa Clara, CA (US)

( * ) Notice: Subject to any disclaimer, the term of this patent is extended or adjusted under 35 U.S.C. 154(b) by 367 days.

(21) Appl. No.: 09/686,469

(22) Filed: Oct. 10, 2000

(51) Int. Cl.$^7$ .............................................. G01R 31/28
(52) U.S. Cl. ..................................................... 714/724
(58) Field of Search ................................. 714/724, 733, 714/738, 27, 32, 33, 734, 726

(56) References Cited

U.S. PATENT DOCUMENTS

| | | | | |
|---|---|---|---|---|
| 5,161,186 A | * | 11/1992 | Dolev et al. .................... | 380/2 |
| 5,187,712 A | * | 2/1993 | Malleo-Roach et al. .... | 714/724 |
| 5,412,665 A | * | 5/1995 | Gruodis et al. ............. | 714/739 |
| 5,457,697 A | * | 10/1995 | Malleo-Roach et al. .... | 714/726 |
| 5,546,408 A | * | 8/1996 | Keller ......................... | 714/741 |
| 5,553,082 A | * | 9/1996 | Connor et al. .............. | 714/733 |
| 5,694,403 A | * | 12/1997 | Greenstein et al. ......... | 714/738 |
| 5,831,988 A | * | 11/1998 | Fagerness .................... | 714/719 |
| 5,862,149 A | * | 1/1999 | Carpenter et al. .......... | 714/726 |
| 6,067,650 A | * | 5/2000 | Beausang et al. ........... | 714/726 |
| 6,131,181 A | * | 10/2000 | Bushnell et al. ............ | 716/4 |
| 6,247,154 B1 | * | 6/2001 | Bushnell et al. ............ | 714/733 |
| 6,360,344 B1 | * | 3/2002 | Khoche et al. ............. | 714/733 |
| 6,423,558 B1 | * | 7/2002 | Maeda et al. ............... | 438/17 |

\* cited by examiner

*Primary Examiner*—Albert Decady
*Assistant Examiner*—Matthew C. Dooley
(74) *Attorney, Agent, or Firm*—Seth Z. Kalson

(57) ABSTRACT

A method for utilizing an XOR network for testing internal nodes of a die wherein the nodes are connected to the input ports of the XOR network. The nodes are chosen by an iterative algorithm whereby the toggled, but not observed nodes, are partitioned into subsets belonging to a test hierarchy whereby the largest subset in the hierarchy is chosen. Based upon this largest subset, a first and second node set is constructed. A functional test is performed wherein the first and second node set, respectively, are inputs and outputs. The second node set serves as inputs to the XOR network. Deeper levels of hierarchies are created if the functional test on the first an second node sets do not meet a fault coverage criterion, or if the hierarchy level is too large, where the deeper test hierarchy is constructed from the largest subset associated with a less deep hierarchy.

16 Claims, 4 Drawing Sheets

DIE FAULT TESTING UTILIZING AN EXCLUSIVE-OR NETWORK OF GATES

FIELD

The present invention relates to circuit testing, and more particularly, to die fault testing utilizing Exclusive-OR gates.

BACKGROUND

Not all die (chips) on a wafer operate as intended. Some may have internal nodes that are stuck at a logical 1 or 0. Consequently, it is desirable for a functional test on a die to cover as many internal circuit nodes as practical. In a functional test, a tester drives input vectors on the input pads of the die, and compares the output vectors on the output pads to the output vectors generated by a simulation running the same functional test on a model of the die. This model may be, for example, a behavioral model, a RTL (Register Transfer Language) model, a gate-level model, or a transistor (circuit-level) model. For an internal node to be tested, the input vector should toggle the node (change its logic state), and the toggling of the node should cause an observable change in the output vector. Thus, there should be good controllability (node toggling), and good observability.

It is found that for many die, it may at times be difficult to obtain a fault coverage of 90% or more, even though a toggle coverage test may show a toggle coverage of 99%. In such cases, there may be many nodes that are easily toggled (good controllability), but such that the toggling is not easily observed in the output vectors (poor observability). If the tester is able to sample internal nodes directly and to utilize longer test vectors, then it is easier to obtain a high fault coverage for functional tests. However, this is not practical because most of the internal nodes in a die are not directly controlled or observed, and because the test has a limited number of vectors that may be examined. Consequently, there is a need for improved practical methods of testing.

DESCRIPTION OF EMBODIMENTS

Embodiments for utilizing an XOR (Exclusive-OR) network of gates, such as a tree network or a chain network, to probe internal nodes are described. In such embodiments, the internal nodes under test are connected or coupled to the input ports of an XOR network, and the output port of the XOR network is observed. Utilizing an XOR network for testing may be advantageous. One reason is because there is no increase in the complexity of the die-to-tester interface. Furthermore, the internal nodes that are connected or coupled to the input ports to the XOR network may be chosen such that there is good observability. To ensure good observability, it is assumed that if there is a fault in more than one node connected or coupled to an input port of the XOR network, then there will be at least one test cycle for which an odd number of such nodes will give erroneous values. Therefore, in an embodiment it may be desirable that no two nodes are connected or coupled to the same XOR tree if they are nested in such a way that any change in the first node's value will always be followed by a change in the second node's value during the same test cycle, e.g., a node A is the inverse of a node B (A=$\bar{B}$).

Figure 1:
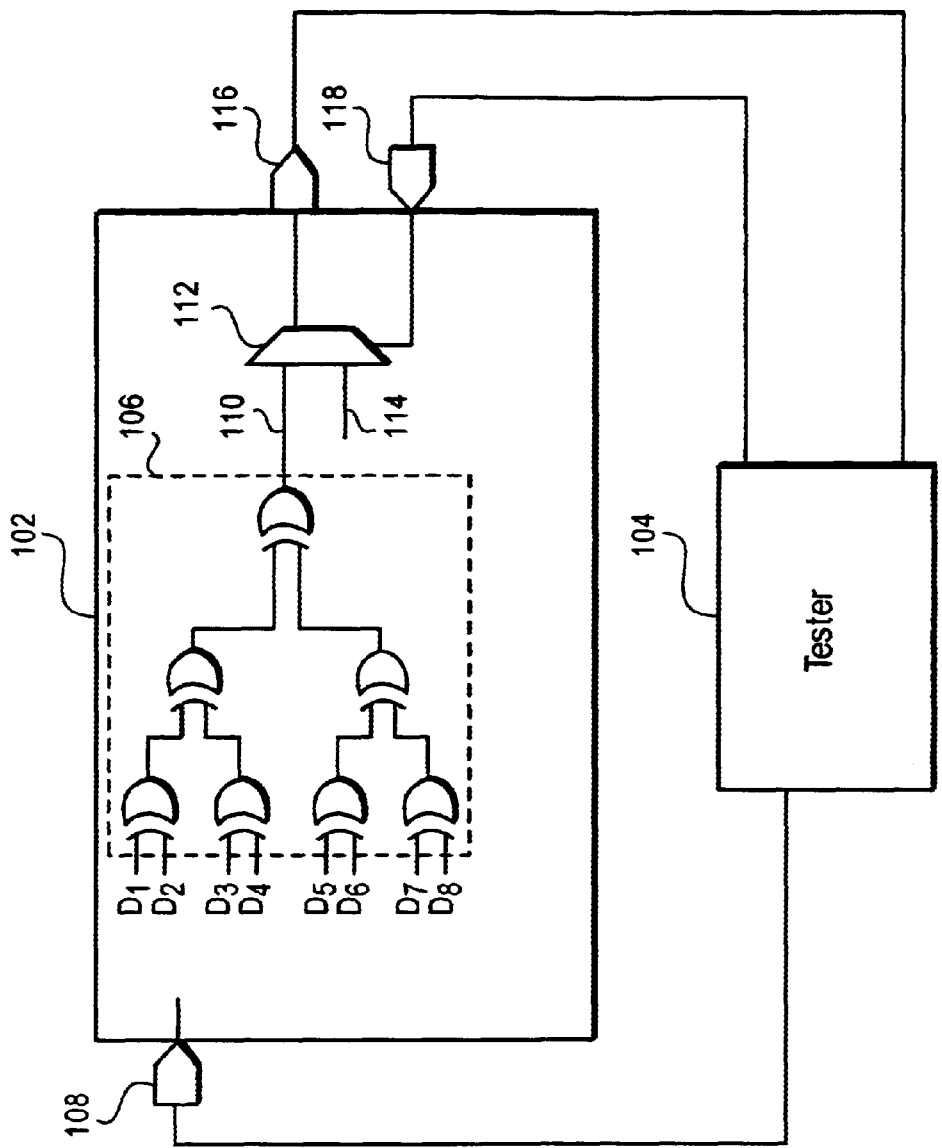
FIG. 1 illustrates a die under test having an XOR network for observing nodes, where the XOR network is in the form of an XOR tree.

FIG. 1 illustrates a testing system comprising die 102 and tester 104. Die 102 has an operating mode and a test mode. In the embodiment of FIG. 1, XOR network 106 is an XOR tree having input ports connected to nodes $D_1, D_2, \ldots, D_8$. Tester 104 drives an input vector on input port 108, and may drive other input ports not shown. The output port of XOR tree 106 is provided to input port 110 of MUX (multiplexer) 112. Input port 114 of MUX 112 is coupled to a set of transistors (not shown) to provide the appropriate output signal to output port 116 when die 102 is in its operating mode. MUX 112 is controlled by tester 104 via test mode input port 118, so that when die 102 is in its test mode, output port 116 is responsive to XOR tree 106, and when die 102 is in its operating mode, output port 116 is responsive to input port 114 so as to provide the appropriate output signal. It is thus seen from FIG. 1 that the use of an XOR network for fault testing simplifies the die-to-tester interface, and that the use of MUX 112 allows output port 116 to be used both as an output port when die 102 is in its operating mode and as an output test port when die 102 is in its test mode.

Figure 2:
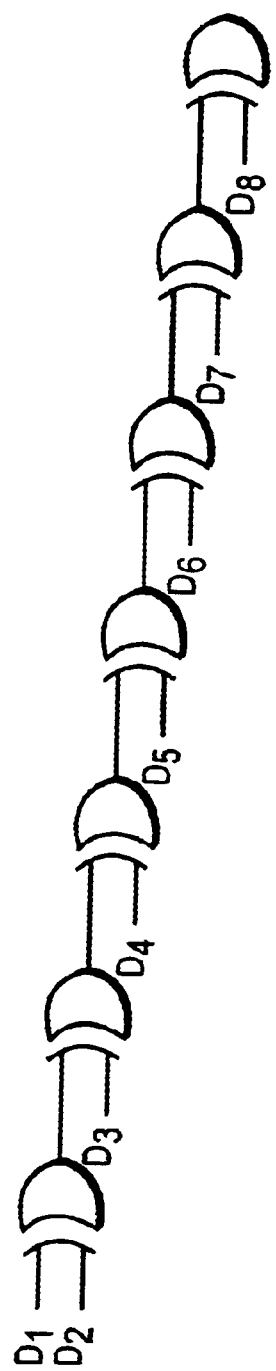
FIG. 2 is an XOR network for testing in the form of an XOR chain.

FIG. 2 illustrates an XOR network in the form of an XOR chain for the particular example of eight inputs $D_1, D_2, \ldots, D_8$. An advantage of an XOR tree over that of an XOR chain is in timing. For an XOR tree, the delay from its first input port to its output port is an XOR gate delay times the number of levels in the tree. When using an XOR chain in a synchronous design, it is preferable in some embodiments to run the test vector pattern having a cycle time larger than the XOR chain delay. It is also possible to add delay flip-flops to the input ports of an XOR chain so as to introduce pipelining, so that a higher test frequency may be used. If a die design comprises various clock domains, it may be preferable in some embodiments to have separate XOR networks for each clock domain. FIGS. 1 and 2 provide two examples of XOR networks, but clearly many other topologies may be used.

Figure 3:
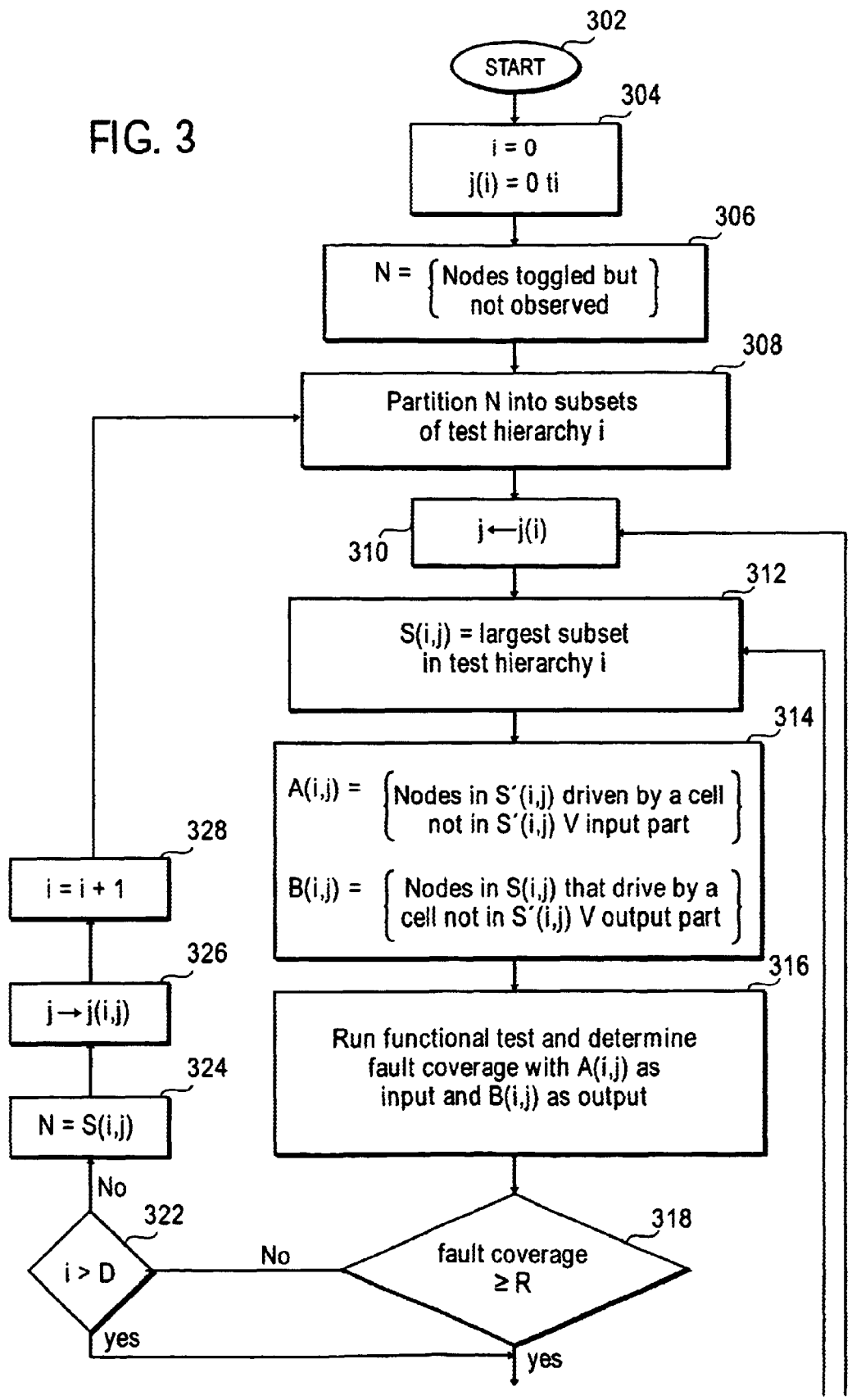
FIG. 3 is a flow diagram illustrating a method for choosing input nodes to an XOR network for testing.
Figure 3:
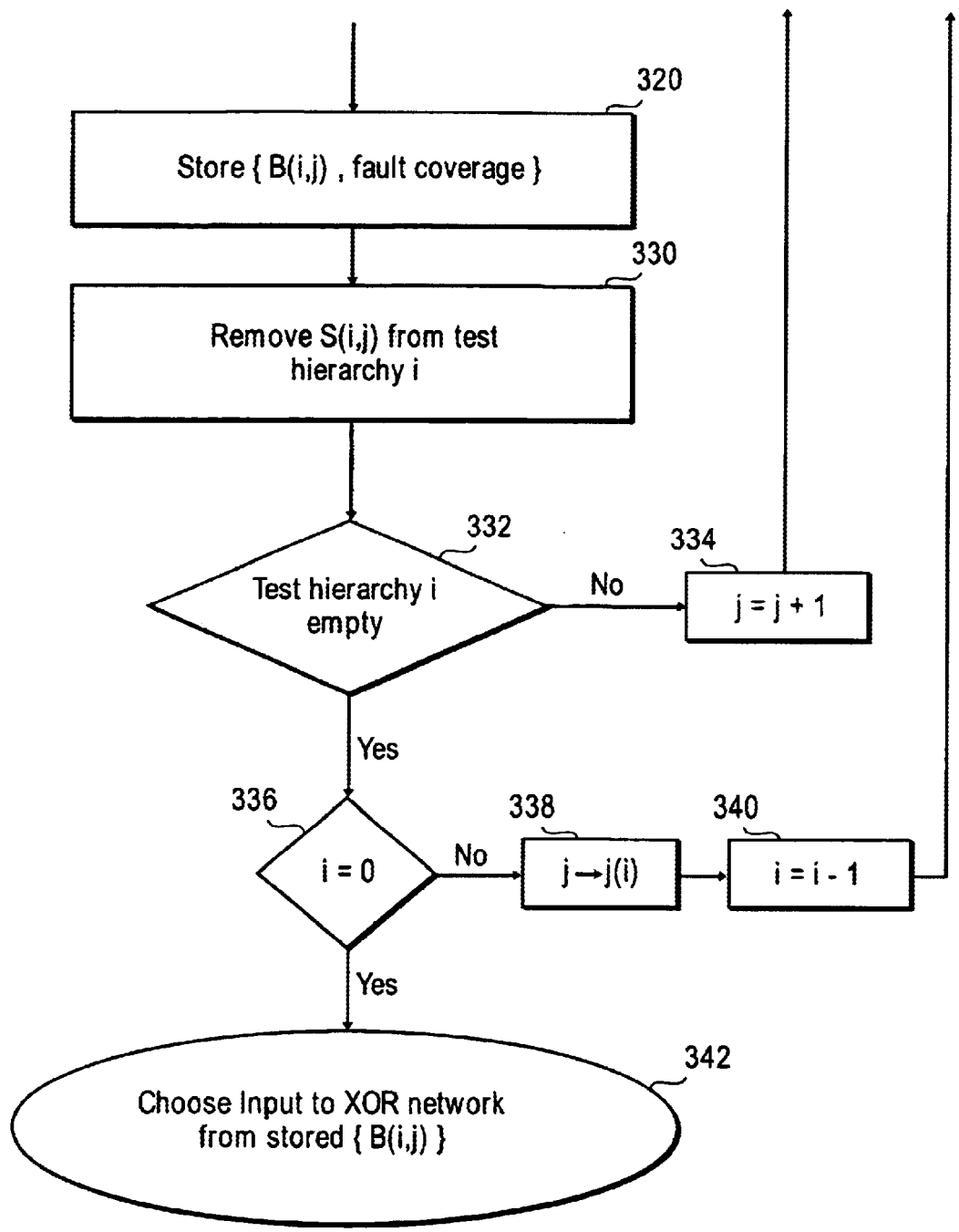

An embodiment of a method for choosing the internal die nodes that are connected or coupled to the input ports of an XOR test network is illustrated in the flow diagram of FIG. 3. The method embodiment begins at block 302, in which it is assumed that a fault grading test has already been performed to provide fault coverage on the internal nodes of the die. A fault grading test is a simulation comprising many functional test iterations. For each iteration, one internal node is fixed by simulation to be stuck at a logical 0 or 1, input ports (pads) on the die are driven by a set of input test vectors, and output vectors on the output ports (pads) are observed and compared with the expected output vectors according to a correct model of the die. Based upon the observed output vectors for all iterations, the fault coverage for the die is determined.

Ideally, fault coverage is most accurately determined by causing all internal nodes during the functional test to be stuck at a logical 0 or 1. However, this is not always practical, so that other well-known techniques may be employed to choose a set of nodes to fix at a logical 0 or 1. For example, a set of nodes to fix at a logical 0 or 1 may be randomly (or pseudo-randomly) chosen, and based upon this random sample, the determined fault coverage is extrapolated to apply to the entire die. Or, various nodes may be chosen from different blocks (perhaps functional-unit blocks) of the die. Of course, the present invention is not limited in scope to a particular method or technique employed in block 302. Regardless of which method is used, it is assumed in block 302 that a fault grading test has been performed with some set of chosen nodes, and that a fault coverage has been determined for the die.

In block 304, the index i denotes a hierarchy level, and j(i) denotes an integer-valued table indexed by i. That is, j(i) may be thought of as a mapping, where the value of an integer i is mapped to another integer. The meaning of j(i) will become clear when describing later aspects of the method of FIG. 3. In block 304, the index i and the table j(i) are initialized to have zero values. The range of i in this embodiment is from 0 to D, where D denotes a hierarchy depth.

In block 306, N is a set of nodes that have been toggled but not observed during the initial fault grading test described for block 302. In block 308, the set N is partitioned into disjoint subsets, defined to belong to a test hierarchy indexed by i. In one embodiment, the subsets may be chosen such that any two nodes belonging to the same subset are separated by at most T levels of logic gates, whereas any two nodes belonging to two different subsets are either separated by more than T levels of logic gates or are not logically coupled to each other. In other embodiments, the subsets obtained as described in the previous sentence are further partitioned into subsets so that the number of nodes within any subset do not exceed some threshold number, or some threshold percentage of the total number of nodes in the set N.

Block 310 sets the value of the index j to the table entry j(i). In block 312, a largest subset, denoted as S(i,j), is chosen from the subsets belonging to hierarchy i. In block 314, using S(i, j), two sets of nodes, denoted as A(i,j) and B(i,j), are constructed in the following manner. First, let S'(i, j) denote the minimum set of cells that are necessary maintain the original functional relationships among the nodes in S(i, j). Let S"(i, j) denote the set of nodes that either are driven by at least one cell in S'(i, j), or drive at least one cell in S'(i, j). Note that S(i, j)⊆S"(i, j). Then, A(i,j) is the set of nodes in S"(i, j) driven by at least one cell not in S'(i, j) or driven by at least one input port (node) of the die, and B(i, j) is the set of nodes in S(i, j) that drive at least one cell not in S'(i, j). In another embodiment, B(i, j) may be a set of nodes in S"(i, j) that drive at least one cell not in S'(i, j).

In block 316, using A(i,j) as a set of input nodes and B(i,j) as a set of output nodes, a fault grading test on the nodes in S(i, j) is performed to determine the fault coverage for S(i, j). This is the same functional test as performed in the description of block 302. Because A(i, j) is now used as the set of input nodes for the functional test, the input vectors appropriate for A(i, j) should be chosen. These input vectors may be obtained by observing the values of the nodes in A(i, j) when the original input vectors are applied to the input ports of the die as described in reference to block 302. In an alternate embodiment, the functional test may be performed with the input ports to the die, as described in reference to block 302, instead of using A(i, j) as the new input ports.

In block 318, it is determined whether or not the fault coverage result of the test performed in block 316 satisfies some fault coverage criterion. In the particular embodiment of FIG. 3, the fault coverage is compared to a threshold R, where for example, R is 100%. If the fault coverage is equal to or greater than R, i.e., the fault coverage criterion is satisfied, then control is brought to block 320, and if the fault coverage is less than R, i.e., the fault coverage criterion is not satisfied, then control is brought to block 322. If control is brought to block 322 and the index i is less than or equal to the hierarchy depth D, then in block 324 the set N is now defined to be the subset S(i,j), in block 326 the current value of the index j is stored in table j(i) at entry position i, the index i is incremented by one in block 328, and control is brought back to block 308.

By incrementing the index i in block 328, a next deeper level test hierarchy is created when block 308 is repeated. If in block 322 the hierarchy index i exceeds the hierarchy depth D, then control is brought to block 320. In this way, the loop consisting of blocks 308, 310, 312, 314, 316, 318, 322, 324, 326, and 328 creates deeper and deeper hierarchy levels (finer and finer node partitions) until either the fault coverage of the currently largest subset in the hierarchy meets or exceeds some fault coverage criterion or the number of hierarchy levels exceeds a depth D.

Note that the hierarchy index i is such that for $i_1 < i_2$, hierarchy $i_1$ has a higher hierarchy level than hierarchy $i_2$, and hierarchy $i_2$ is deeper than hierarchy $i_1$. For the particular embodiment of FIG. 3, the highest hierarchy has a hierarchy index of 0.

In block 320, the subset B(i,j) along with its fault coverage is stored, and control is brought to block 330 where S(i,j) is removed from the test hierarchy level i. In addition to storing the fault coverage for B(i, j), in some embodiments a "goodness" value may be stored for each node within B(i, j), where the goodness value for some node a belonging to B(i, j) indicates the number of nodes in S"(i, j) fixed at a logical 0 or 1 during the fault grading test that caused a change in the output value of the node a.

Block 332 determines whether or not the test hierarchy level i is empty. If it is not empty, then the index j is incremented by one in block 334 and control is brought back to block 312. If the test hierarchy i is empty, then block 336 determines whether nor not the hierarchy index i is equal to zero. If it is not, then in block 338 the current value of the index j is stored in table j(i), in block 340 the index i is decremented by one, and control is brought back to block 310. If in block 336 the index i is equal to zero, then in block 342 the input nodes to the XOR network are chosen from the set of stored B(i,j). In one embodiment, the set of input nodes for the XOR network is the smallest set of nodes within the set of stored B(i,j) that satisfy a desired fault coverage.

Various modifications may be made to the disclosed embodiments without departing from the scope of the invention as claimed below.

I claim:

1. A method for choosing internal nodes in a die to be coupled to input ports of an XOR network for fault coverage; the die having input ports, output ports, and an original functional relationship among the input ports, output ports, and internal nodes; the method comprising, in sequence:
   (1) testing the internal nodes for fault coverage;
   (2) based upon the testing of (1), generating a set N of nodes that were toggled but not observed;
   (3) partitioning the set N into subsets of nodes belonging to a test hierarchy indexed by an index i; and
   (4) choosing a largest subset S(i) in the test hierarchy of index i, and choosing two sets of nodes A(i) and B(i), where A(i) is the set of nodes belonging to the set S"(i) that are driven by at least one cell not in S'(i) or that are driven by at least one input port of the die, and B(i) is the set of nodes belonging to the set S(i) that drive at least one cell not in S'(i), where S'(i) is the minimum set of cells necessary to maintain the original functional relationship for all nodes in the set S(i), and S"(i) is the set of nodes that are driven by at least one cell in S'(i) or that drive at least one cell in S'(i).

2. The method as set forth in claim 1, further comprising, in sequence:

(5) performing a functional test with A(i) as input nodes and B(i) as output nodes to obtain an associated fault coverage.

3. The method as set forth in claim 2, further comprising, in sequence:

(6) provided the fault coverage of the functional test in (5) does not meet a fault coverage criterion and the test hierarchy index i is not greater than a hierarchy depth, setting the set N equal to the set S(i), incrementing the test hierarchy index i, and repeating in sequence (3) through (5) with the incremented test hierarchy index.

4. The method as set forth in claim 3, further comprising, in sequence:

(7) provided the fault coverage of the functional test in (5) satisfies the fault coverage criterion, or the test hierarchy index i is greater than the hierarchy depth, storing the set B(i) and its associated fault coverage;

(8) removing the set S(i) from the test hierarchy indexed by i; and (9) provided the test hierarchy indexed by i is not empty, repeating in sequence (4) through (8); provided the test hierarchy indexed by i is empty and the test hierarchy index does not indicate the lowest hierarchy index, decrementing the test hierarchy index i and repeating in sequence (4) through (8); and provided the test hierarchy indexed by i is empty and is the highest hierarchy level, choosing the input nodes to the XOR network from the stored B(i) based upon its associated fault coverage.

5. A method for choosing internal nodes in a die to be coupled to input ports of an XOR network for fault coverage; the die having input ports, output ports, and an original functional relationship among the input ports, output ports, and internal nodes; the method comprising, in sequence:

(1) testing the internal nodes for fault coverage;

(2) based upon the testing of (1), generating a set N of nodes that were toggled but not observed;

(3) partitioning the set N into subsets of nodes belonging to a test hierarchy indexed by an index i; and (4) choosing a largest subset S(i) in the test hierarchy of index i, and choosing two sets of nodes A(i) and B(i), where A(i) is the set of nodes belonging to the set S"(i) that are driven by at least one cell not in S'(i) or that are driven by at least one input port of the die, and B(i) is the set of nodes belonging to the set S"(i) that drive at least one cell not in S'(i), where S'(i) is the minimum set of cells necessary to maintain the original functional relationship for all nodes in the set S(i), and S"(i) is the set of nodes that are driven by at least one cell in S'(i) or that drive at least one cell in S'(i).

6. The method as set forth in claim 5, further comprising, in sequence:

(5) performing a functional test with A(i) as input nodes and B(i) as output nodes to obtain an associated fault coverage.

7. The method as set forth in claim 6, further comprising, in sequence:

(6) provided the fault coverage of the functional test in (5) does not meet a fault coverage criterion and the test hierarchy index i is not greater than a hierarchy depth, setting the set N equal to the set S(i), incrementing the test hierarchy index i, and repeating in sequence (3) through (5) with the incremented test hierarchy index.

8. The method as set forth in claim 7, further comprising, in sequence:

(7) provided the fault coverage of the functional test in (5) satisfies the fault coverage criterion, or the test hierarchy index i is greater than the hierarchy depth, storing the set B(i) and its associated fault coverage;

(8) removing the set S(i) from the test hierarchy indexed by i; and (9) provided the test hierarchy indexed by i is not empty, repeating in sequence (4) through (8); provided the test hierarchy indexed by i is empty and the test hierarchy index does not indicate the lowest hierarchy index, decrementing the test hierarchy index i and repeating in sequence (4) through (8); and provided the test hierarchy indexed by i is empty and is the highest hierarchy level, choosing the input nodes to the XOR network from the stored B(i) based upon its associated fault coverage.

9. An article of manufacture comprising a computer readable medium to cause execution of a method for choosing internal nodes in a die to be coupled to input ports of an XOR network for fault coverage; the die having input ports, output ports, and an original functional relationship among the input ports, output ports, and internal nodes; the method comprising, in sequence:

(1) testing the internal nodes for fault coverage;

(2) based upon the testing of (1), generating a set N of nodes that were toggled but not observed;

(3) partitioning the set N into subsets of nodes belonging to a test hierarchy indexed by an index i; and (4) choosing a largest subset S(i) in the test hierarchy of index i, and choosing two sets of nodes A(i) and B(i), where A(i) is the set of nodes belonging to the set S"(i) that are driven by at least one cell not in S'(i) or that are driven by at least one input port of the die, and B(i) is the set of nodes belonging to the set S(i) that drive at least one cell not in S'(i), where S'(i) is the minimum set of cells necessary to maintain the original functional relationship for all nodes in the set S(i), and S"(i) is the set of nodes that are driven by at least one cell in S'(i) or that drive at least one cell in S'(i).

10. The article of manufacture as set forth in claim 9, the method further comprising, in sequence:

(5) performing a functional test with A(i) as input nodes and B(i) as output nodes to obtain an associated fault coverage.

11. The article of manufacture as set forth in claim 10, the method further comprising, in sequence:

(6) provided the fault coverage of the functional test in (5) does not meet a fault coverage criterion and the test hierarchy index i is not greater than a hierarchy depth, setting the set N equal to the set S(i), incrementing the test hierarchy index i, and repeating in sequence (3) through (5) with the incremented test hierarchy index.

12. The article of manufacture as set forth in claim 11, the method further comprising, in sequence:

(7) provided the fault coverage of the functional test in (5) satisfies the fault coverage criterion, or the test hierarchy index i is greater than the hierarchy depth, storing the set B(i) and its associated fault coverage;

(8) removing the set S(i) from the test hierarchy indexed by i; and (9) provided the test hierarchy indexed by i is not empty, repeating in sequence (4) through (8); provided the test hierarchy indexed by i is empty and the test hierarchy index does not indicate the lowest hierarchy index, decrementing the test hierarchy index i and repeating in sequence (4) through (8); and provided the test hierarchy indexed by i is empty and is the highest hierarchy level, choosing the input nodes to the XOR network from the stored B(i) based upon its associated fault coverage.

13. An article of manufacture comprising a computer readable medium to cause execution of a method for choosing internal nodes in a die to be coupled to input ports of an XOR network for fault coverage; the die having input ports, output ports, and an original functional relationship among the input ports, output ports, and internal nodes; the method comprising, in sequence:

(1) testing the internal nodes for fault coverage;

(2) based upon the testing of (1), generating a set N of nodes that were toggled but not observed;

(3) partitioning the set N into subsets of nodes belonging to a test hierarchy indexed by an index i; and (4) choosing a largest subset S(i) in the test hierarchy of index i, and choosing two sets of nodes A(i) and B(i), where A(i) is the set of nodes belonging to the set S"(i) that are driven by at least one cell not in S'(i) or that are driven by at least one input port of the die, and B(i) is the set of nodes belonging to the set S"(i) that drive at least one cell not in S'(i), where S'(i) is the minimum set of cells necessary to maintain the original functional relationship for all nodes in the set S(i), and S"(i) is the set of nodes that are driven by at least one cell in S'(i) or that drive at least one cell in S'(i).

14. The article of manufacture as set forth in claim 13, the method further comprising, in sequence:

(5) performing a functional test with A(i) as input nodes and B(i) as output nodes to obtain an associated fault coverage.

15. The article of manufacture as set forth in claim 14, the method further comprising, in sequence:

(6) provided the fault coverage of the functional test in (5) does not meet a fault coverage criterion and the test hierarchy index i is not greater than a hierarchy depth, setting the set N equal to the set S(i), incrementing the test hierarchy index i, and repeating in sequence (3) through (5) with the incremented test hierarchy index.

16. The article of manufacture as set forth in claim 15, the method further comprising, in sequence:

(7) provided the fault coverage of the functional test in (5) satisfies the fault coverage criterion, or the test hierarchy index i is greater than the hierarchy depth, storing the set B(i) and its associated fault coverage;

(8) removing the set S(i) from the test hierarchy indexed by i; and (9) provided the test hierarchy indexed by i is not empty, repeating in sequence (4) through (8); provided the test hierarchy indexed by i is empty and the test hierarchy index does not indicate the lowest hierarchy index, decrementing the test hierarchy index i and repeating in sequence (4) through (8); and provided the test hierarchy indexed by i is empty and is the highest hierarchy level, choosing the input nodes to the XOR network from the stored B(i) based upon its associated fault coverage.

* * * * *